United States Patent [19]

Tomomatsu

[11] Patent Number: 5,623,872
[45] Date of Patent: Apr. 29, 1997

[54] APPARATUS AND METHOD FOR SEPARATING A MASK PLATE AND PRINTED CIRCUIT BOARD

[75] Inventor: Michinori Tomomatsu, Fukuoka, Japan

[73] Assignee: Matsushita Electric Industrial Co. Ltd., Osaka, Japan

[21] Appl. No.: 422,180

[22] Filed: Apr. 14, 1995

[30] Foreign Application Priority Data

Apr. 14, 1994 [JP] Japan .................................. 6-075817

[51] Int. Cl.⁶ ............................................ B41F 15/18
[52] U.S. Cl. .................................... 101/126; 101/129
[58] Field of Search ................ 101/41, 114, 126, 101/129, 474; 427/96, 282

[56] References Cited

U.S. PATENT DOCUMENTS 4,902,371  2/1990  Andris et al. ............................ 101/129
5,174,201  12/1992  Andris et al. ........................... 101/129

FOREIGN PATENT DOCUMENTS 34335     2/1990  Japan .................................. 101/129
60750     3/1990  Japan .................................. 101/129
4-65243   3/1992  Japan .

*Primary Examiner*—Stephen R. Funk
*Attorney, Agent, or Firm*—McDermott, Will & Emery

[57] ABSTRACT

A screen printing apparatus and method suitable for applying solder paste on a printed circuit board, wherein a printed circuit board is brought just under a mask plate with patterned holes. The patterned holes are filled with solder paste. The printed circuit board is separated from the mask plate using intermittent movements that lower the adhesivity of the solder paste located nearest to the walls of the patterned holes so that the solder paste is easily separated from the patterned holes and the solder paste, which remains on the printed circuit board, is not deformed.

12 Claims, 8 Drawing Sheets

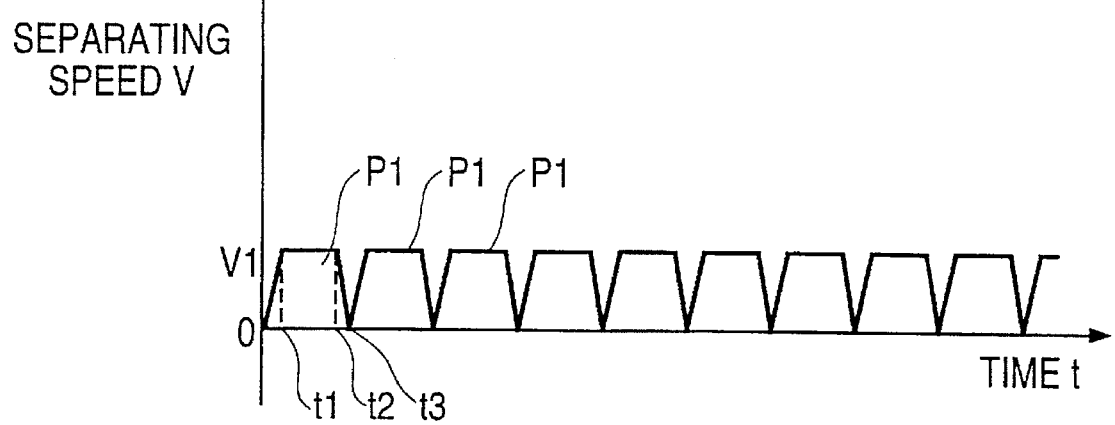
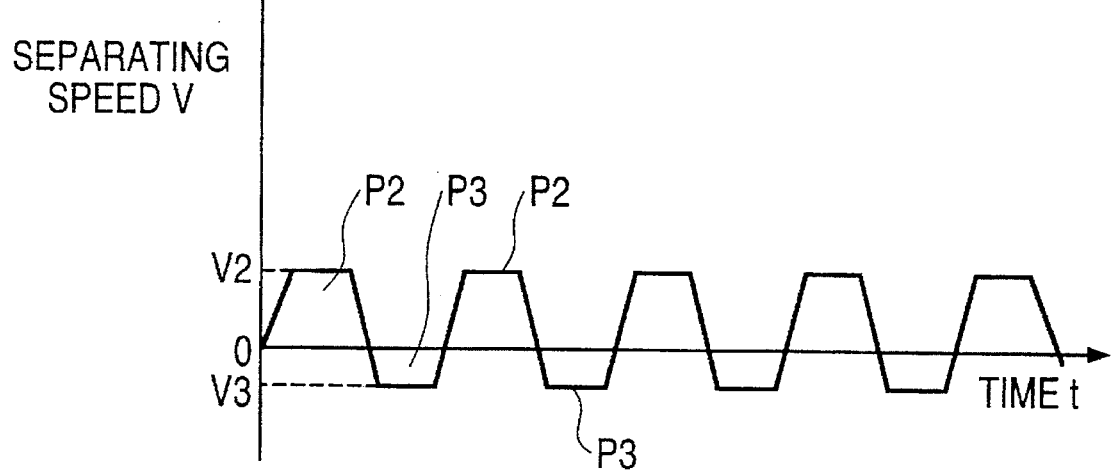

APPARATUS AND METHOD FOR SEPARATING A MASK PLATE AND PRINTED CIRCUIT BOARD

FIELD OF THE INVENTION

This invention relates to a screen printing apparatus and method for applying solder paste to a printed circuit board for soldering electronic components.

BACKGROUND OF THE INVENTION

When a printed circuit board is mounted with electronic components such as integrated circuits, condenser chips, resistor chips and the like, solder paste is applied by a screen printing apparatus to the board for soldering the electronic components to the electrodes of the patterned circuit thereon.

Generally, in a screen printing apparatus of such a kind, as shown in the Laid Open Japanese Patent Application No. Toku-Kai-Hei 4-65243, the printed circuit board is brought near the under side of the screen mask. A squeegee slides on the mask to apply solder paste onto predetermined points on the board through patterned holes located in the mask. A screen printing apparatus of the prior art, as shown in FIG. 9, comprises a screen mask 1 having a mask plate 2 applied to the under side of a holder 3 of a frame shape. A printed circuit board 4 is held on a table 5, having nuts 6a and 6b combined with vertical screws 7a and 7b. One screw 7a is rotatably driven by a motor 8. The screws 7a and 7b are provided with timing pulleys 9a and 9b, and a timing belt 10. The screw 7b has a bearing 11.

When motor 8 is energized or engaged, screw 7a rotates, and the rotation is transferred to another screw 7b via timing pulleys 9a, 9b and timing belt 10. By the simultaneous rotations of both screws 7a and 7b, table 5 and printed circuit board 4 ascend or descend with respect to mask plate 2. The apparatus is further provided with a squeegee 12 that slides on mask plate 2 to apply solder paste 13 on board 4.

By the rotation of motor 8, board 4 ascends, so that the upper surface of board 4 is placed in contact with the under surface of mask plate 2. If squeegee 12 is slid to the left on mask plate 2 by a driving means not shown in the figure, solder paste 13 is applied on the upper surface of board 4 through holes in plate 2. When motor 8 is rotated in the opposite direction, board 4 descends away from plate 2, thereby completing the solder paste application process.

In the past, in the application of solder paste 13, a small space (generally called "snap-off") had been preserved between mask 2 and board 4. However, as the leads of the electronic components have become arranged with an increasingly smaller and smaller pitch, the snap-off became smaller and smaller, eventually coming to null, in recent years. As a result, the application of solder paste 13 is performed with the under side of mask plate 2 touching the upper surface of board 4.

However, if the solder paste application is performed with the under side of mask plate 2 and the upper side of board 4 touching one another, then a problem occurs, namely, when board 4 is moved away from mask plate 2, the resultant shape of solder paste 13 on board 4 is undesirably deformed.

The reason for this deformation in shape can be explained with reference to FIGS. 10(a) to (c). FIG. 10(a) shows the state of solder paste 13 just after its application squeegee 12. The patterned holes of mask plate 2 are, as a result of sliding of squeegee 12, filled with solder paste 13, and by its adhesive power, the under side of mask plate 2 is adhered no the upper side of board 4.

If board 4 is lowered by the reverse rotation of motor 8, then mask plate 2 gradually bends downwards, because it undesirably adheres to board 4 by the adhesive power of solder paste 13 (FIG. 10(b)). When board 4 is lowered further, mask plate 2 abruptly separates from board 4, and returns to its horizontal state as shown by the solid line in FIG. 10(c) through its own elastic force. Mask plate 2 is made from a flexible thin plate of metal such as stainless steel.

In the process described above in which the printed circuit board 4 is lowered away from mask plate 2, the mask plate is abruptly separated by its own elastic force from board 4 when board 4 is lowered, thereby causing solder paste 13 in the patterned holes to become deformed or left in the holes.

Examples of solder paste applied by a conventional screen-printing apparatus are shown in FIG. 11, in which the configuration of solder paste 13b is a good one, and the configuration of solder paste 13c is an inferior or undesirable one deformed by the above described reason with the edge unnecessarily projecting. With such a deformed solder paste 13c, it is difficult to solder the lead of an electronic component thereto. Such deformation is notable as the pitch of the patterned holes becomes smaller, and is troublesome when electronic components with increasingly smaller lead-pitches are applied on a printed circuit board.

Likewise as in the apparatus described above in which screen mask 1 is stationary and printing board 4 descends, the same problem arises in an apparatus in which the mask descends to, or ascends from; the stationary board.

Thus, an object of the present invention is to provide a screen printing apparatus and method for applying solder paste on a printing board with a mask plate, whereby the applied solder paste does not become deformed when the mask and the board are separated.

SUMMARY OF THE INVENTION

To attain the above object, a screen printing apparatus according to the present invention comprises a squeegee which slides on the mask plate of screen mask, a board supporting part which supports the printed circuit board, and an elevating means which raises and lowers the board supporting part so as to make the upper surface of the printed circuit board move toward or away from the under side of the mask plate with a speed pattern which comprises unit speed patterns, each unit speed pattern beginning with zero, has a nonzero middle value and ends with zero. With such a structure, the screen printing apparatus of the present invention separates the printed circuit board and the mask plate gradually, repeating moves and stops, i.e., through a series of intermittent movements. In the process, slips and stops occur between the solder particles near the walls of the patterned holes to reduce the viscosity of the solder paste of this part. As a result, the solder paste can be easily separated from the patterned holes without any undesirable deformation.

BRIEF DESCRIPTION OF THE DRAWINGS

FIG. 3 is a diagram exemplifying a pattern of speed V versus time t of the printed circuit board against the mask plate.

FIG. 4 is a diagram exemplifying another pattern of the speed versus time.

EXPLANATION OF EMBODIMENTS

Figure 8A:
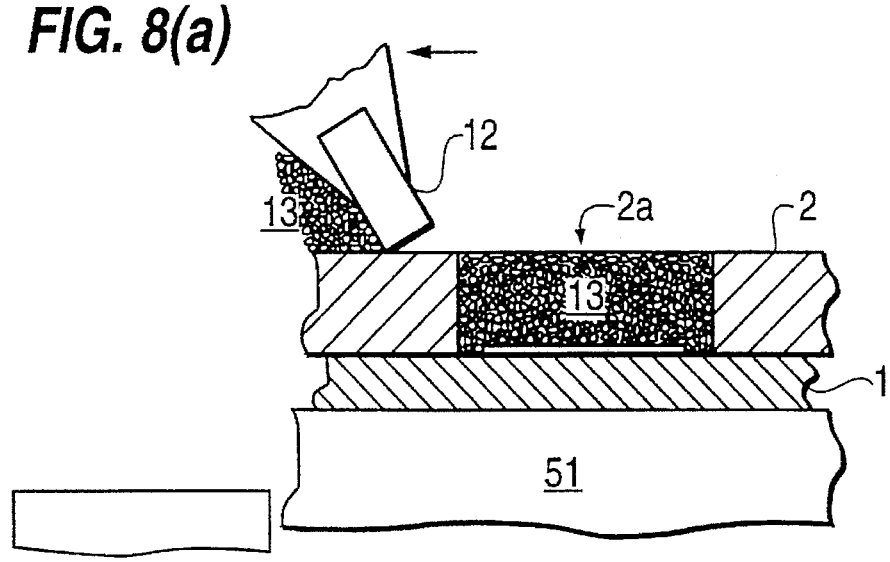
FIGS. 8(a), (b), and (c) are diagrams explaining the states of the solder paste when the mask plate is taken off the printed circuit board with the paste left.
Figure 8B:
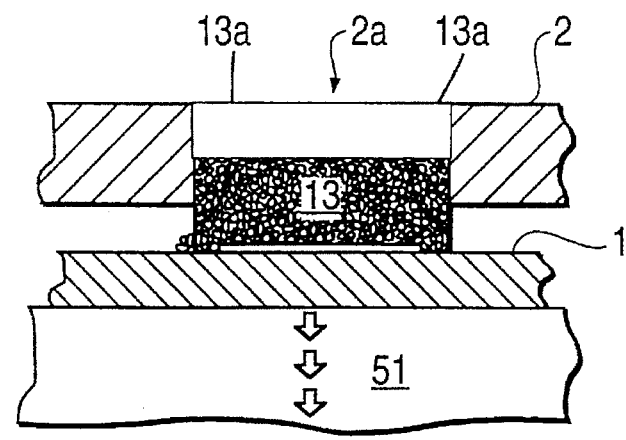
Figure 8C:
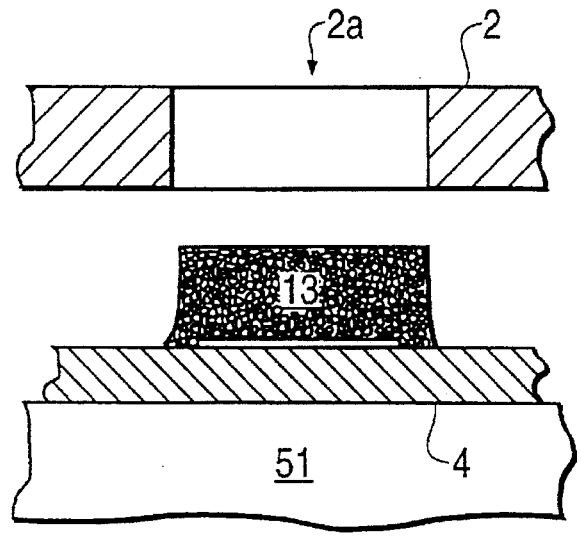
Figure 9:
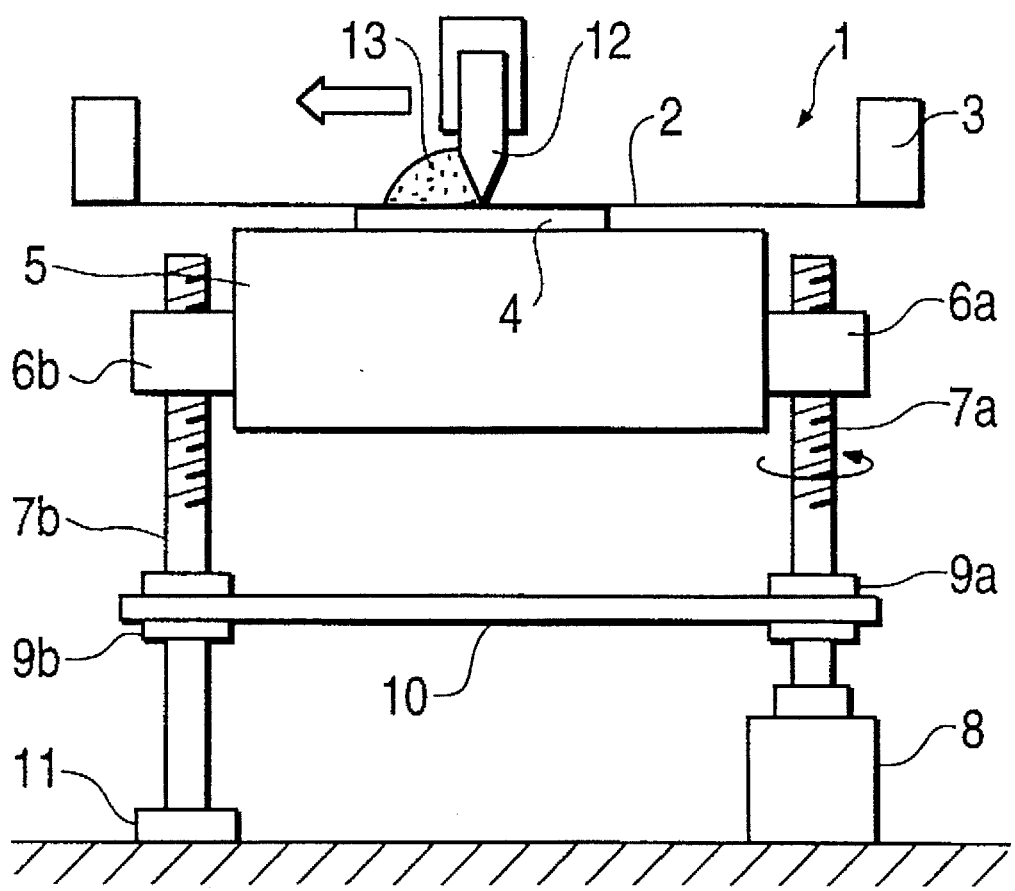
FIG. 9 is the front view of a screen printing apparatus of prior art.
Figure 10A:
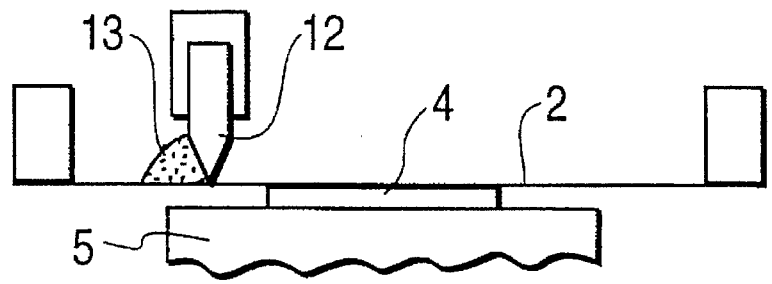
FIGS. 10 (a), (b), and (c) are fragmentary sectional views of the masks and the printed circuit boards, as the mask on the board is taken off, in a prior art apparatus.
Figure 10B:
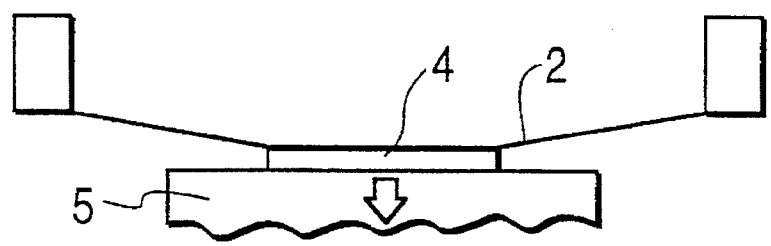
Figure 10C:
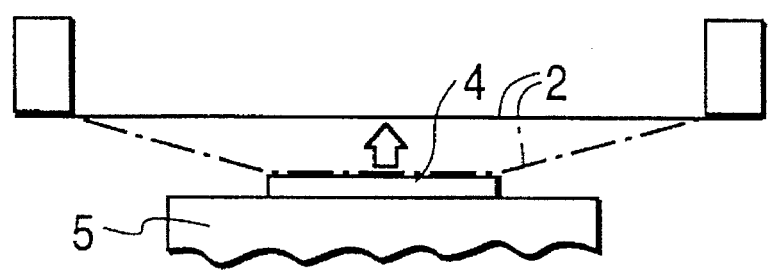
Figure 11:
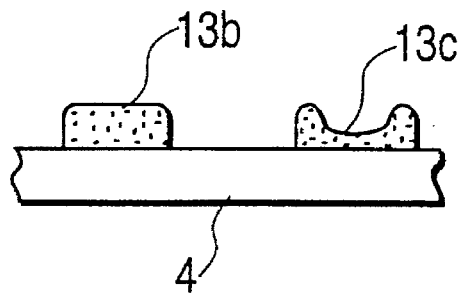
FIG. 11 is a diagram illustrating solder paste deposited by a screen printing apparatus of prior art.

Now, referring to the drawings, an embodiment of the present invention is explained. Elements of the apparatus which are similar to those used in the prior art apparatus as shown in FIG. 8, FIG. 9, and FIG. 10 are given the same number and the explanations therefor are omitted.

Figure 1:
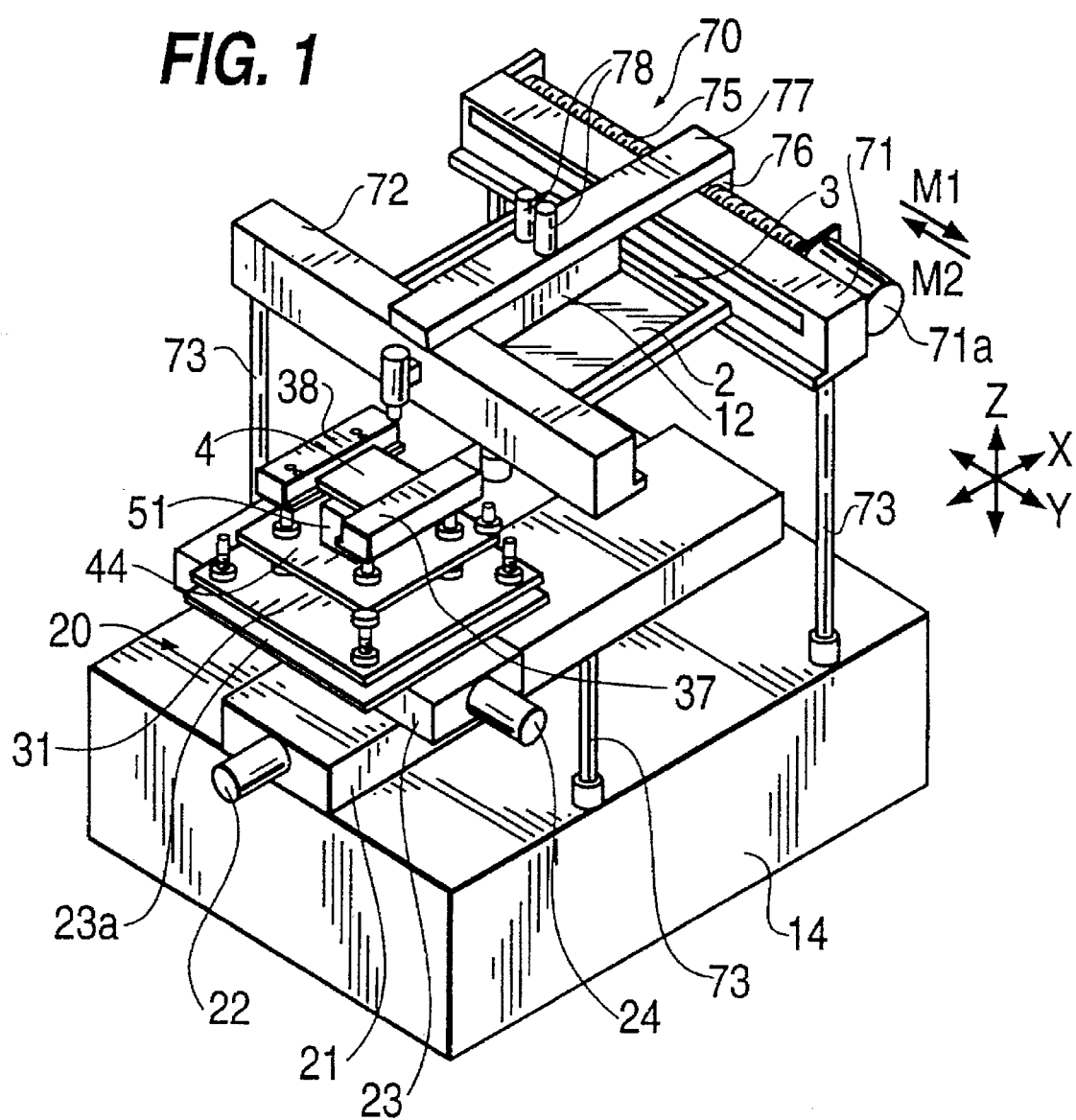
FIG. 1 shows a perspective view of a screen printing apparatus embodying the present invention.

Referring to FIG. 1, a screen printing apparatus exemplifying the present invention comprises a base 14 and a board positioning part 20 thereon for positioning the board. The apparatus also comprises a mask holder 70 to keep a screen mask 2 which is held in a magazine not shown. Mask holder 70 comprises mask guides 71 and 72 arranged horizontally and parallel to each other running in Y-axis, and supported by supports 73 standing on base 14. Mask guide 71 is provided with a screw 75, parallel thereto, supported at both ends and rotated by a motor 71a. A mask plate 2 with a frame 3 is supported on edges at the inner sides of mask guides 71 and 72. A squeegee 12 on top of mask plate 2 is securely suspended by a suspending plate 77. The suspending plate 77 is supported at both ends thereof by the upper surface of mask guides 71 and 72 and is provided at one end with a nut 76 to which screw 75 is fitted. When one of the squeegees 12 is lowered by one of the squeegee driving means 78 and motor 71a is energized, then squeegee 12 can be slid on mask plate 2 to the left and to the right (M1 or M2 direction in the figure).

Figure 2:
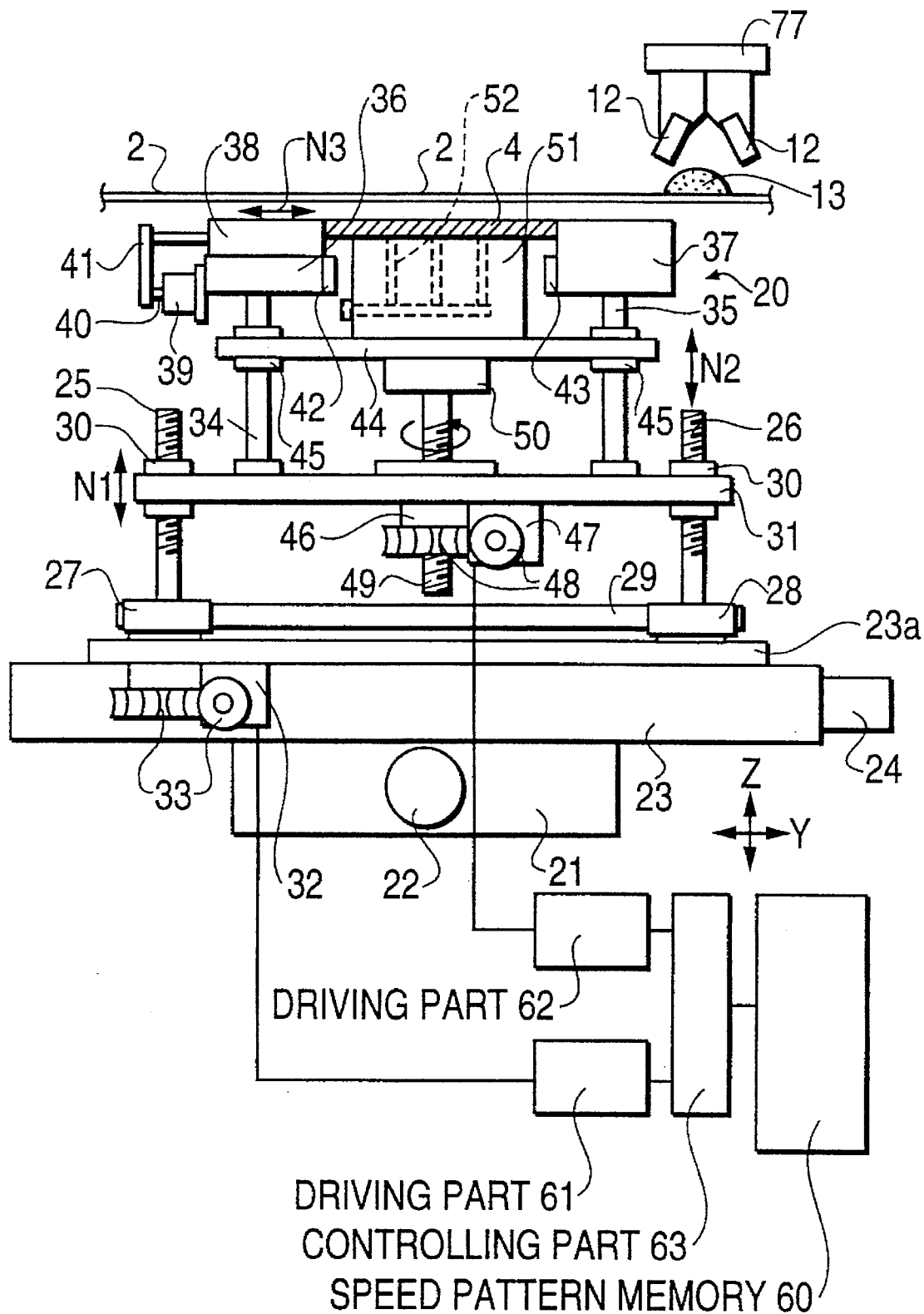
FIG. 2 is a front view of the board positioning part of a screen printing apparatus embodying the present invention.

Referring to FIG. 2 as well as FIG. 1, board positioning part 20 comprises an X-table 21 which is placed on top of base 14 and driven by an X-motor 22, and a Y-table 23 which is placed on top of X-table 21 and driven by a Y-motor 24. Y-table 23 is provided with a plate 23a, which is further provided with a first screw 25 and a second screw 26 supported rotation free. First screw 25 and second screw 26 are provided with timing pulleys 27 and 28 near their lower ends, and timing pulleys 27 and 28 are provided with a timing belt 29. Near the upper ends of first screw 25 and second screw 26, nuts 30 are fitted, which are fixed at the four corners of a first elevating plate 31. First screw 25 is driven by a first Z-motor 32 placed on the under surface of plate 23a by way of gears 33. Therefore, when first Z-motor 32 rotates, it drives, through gears 33, timing pulley 27, timing belt 29, and timing pulley 28, first screw 25 and second screw 26, to raise or lower first elevating plate 31 (in the N1-arrow direction in FIG. 2).

Standing on first elevating plate 31 are elevating guides 34 and 35, which are provided with a first block 36 and a second block 37 of square pillar shape respectively, and which are arranged horizontally so as to bridge the two adjacent guides 34 and 35. First block 36 is also provided thereon with a clamper 38 of square pillar shape, which is arranged parallel with block 36, and which is slidable in the direction perpendicular to the lengthwise direction thereof or of block 36 (in the N3-arrow direction in FIG. 2). The upper surfaces of clamper 38 and block 37 are made coplanar to support mask plate 2. First block 36 is also provided with a slide cylinder 39 on the vertical outer side surface. Cylinder 39 has a rod 40 projecting further outwards and connected with the outer side of clamper 38 via an L-shaped arm 41. Accordingly, when slide cylinder 39 is energized, rod 40 protrudes or withdraws, and clamper 38 moves horizontally (in the N3-arrow direction), to clamp printing board 4 with second block 37. First block 36 and second block 37 are provided with conveyers 42 and 43 respectively on the opposing sides thereof to transfer printing board 4 along the length direction of the blocks or in a direction that is perpendicular to the plane of the drawing in FIG. 2.

Elevation guides 34 and 35 are provided with a second elevating plate 44 which is non-movable in a vertical direction (N2 direction) through bearings 45. Second elevating plate 44 is provided with a third screw 49 with a bearing 50 fixed at the under side thereof. Third screw 49 passes through first elevating plate 31 and is provided with a nut 46. Nut 46 has a part on its upper side to hold rotation-free first elevating plate 31 in between, and is driven through gears 48 attached thereto by the rotation of a second Z-motor 47 which is fixed at the under side of first elevating plate 31. Second elevating plate 44 is provided on its upper surface with a sucker block 51 with sucking pipes 52 therein no suck printing board 4 at its lower side. Hence, if second Z-motor 47 is energized, nut 46 is rotated by gears 48, and second elevating plate 44 and sucker block 51 are raised or lowered against first elevating plate 31.

Thus, sucker block 51 supports the printing board and thereby forms a printing board supporting part. First Z-motor 32, gears 33, timing pulleys 27 and 28, timing belt 29, first and the second screws 25 and 26, second Z motor 47, gears 48, third screw 49, and nut 46 form an elevation means for raising or lowering the upper surface of printing board 4 held by the printing board supporting part with reference to mask plate 2. In addition to the combination of stationary mask plate 2 and moving printing board 4 of the above example, another combination consisting of a stationary printing board 4 and a moving mask plate 2 may be possible.

The apparatus further comprises a controlling part comprising a speed pattern memory 60, a controller 63, and two driving parts 61 and 62. Speed pattern memory 60 is a RAM that stores a speed pattern or a desirable change of speed against time which consists of a combination of speed variations beginning with speed V=0, having a medium value V≠0, and ending with V=0, which is explained in detail later. Driving parts 61 and 62 comprise circuits to drive first Z motor 32 and second Z motor 47. Controlling part 63 comprises a CPU to control first and second Z motors 32 and 47, by controlling driving parts 61 and 62 based on the information in speed pattern memory 60.

An example of the speed pattern is shown in FIG. 3, which consists of a repetition of a same pattern P1. First unit pattern P1 is of trapezoid form, which begins with V=0, has constant V=V$_1$ from time t$_1$ to time t$_2$, and ends with V=0. By one unit move according to the unit speed pattern, mask plate 2 and printing board 4 are separated about several tens of microns to several hundreds of microns.

Figure 7:
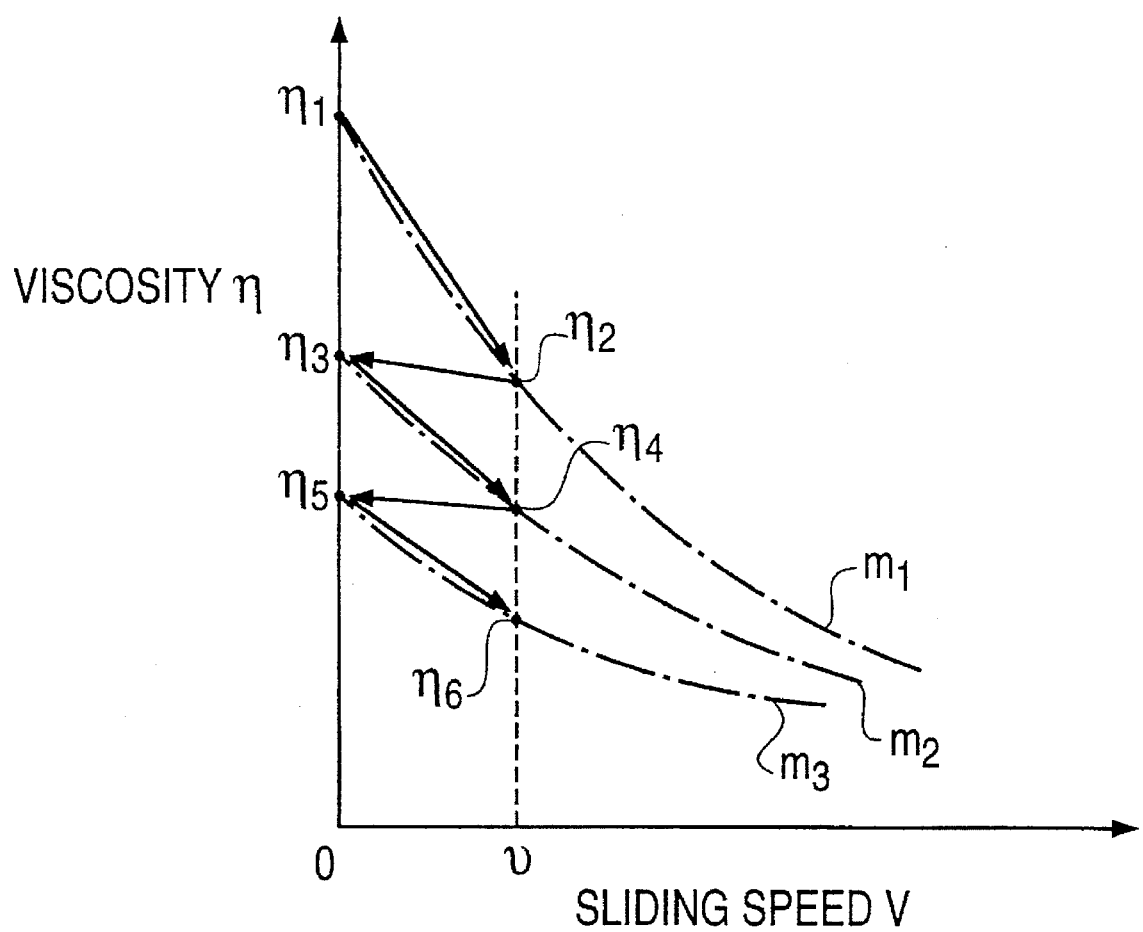
FIG. 7 is a graph showing the variation of viscosity of a solder paste against sliding speed.

The screen printing apparatus works as follows. When a printing board 4 is brought by conveyers 42 and 43 over sucker block 51, second Z-motor 47 is energized to raise block 51; block 51, with sucking pipes 52, sucks and holds the printing board, and raises it so that the upper surface thereof becomes coplanar with the plane formed by the upper surfaces of second block 37 and clamper 38; then, X-motor 22 and Y-motor 24 are energized to bring printing board 4 at the horizontally desired position under mask plate 2; first Z-motor 32 is energized and raises printing board 4 to have its upper surface contacted with the under surface of mask plate 2; squeegee 12 is moved over mask plate 2 to fill solder paste 13 in pattern holes 2a; after all the patterned holes 2a of plate 2 are filled with solder paste 13, controlling part 63 reads out the speed pattern in speed pattern memory 60, and, in accordance with this pattern, separates printing board 4 from the under surface of mask plate 3, using first Z-motor 32 via the driving part 61 (FIG. 8(b)). The solder paste is prepared by mixing solder particles having a diameter of several tens of microns in a flux. Accordingly, when printing board 4 is lowered with the speed pattern shown in FIG. 3, there is generated a slide or shearing between the solder particles located nearest to the wall of pattern holes 2a. FIG. 7 is a graph showing the relationship between the viscosity and the sliding speed in the solder paste. It has been known that the viscosity $\eta$ in the solder paste 13 is lowered when a sliding speed is generated between the solder particles, and that the viscosity once lowered is not recovered for some while—a property known as thixotropy. When printing board 4 is lowered intermittently as described above, a sliding speed v is produced in solder paste 13a near the walls of the patterned holes resulting in a decrease of viscosity $\eta$.

Referring to FIG. 7, by the first lowering movement of the printing board according to pattern P1, sliding speed v is generated in solder paste 13 near the wall of the patterned hole making the initial viscosity $\eta_1$ of solder paste 13 to $\eta_2$ along curve $m_1$. When printing board 4 stops, the viscosity rises to $\eta_3$. However, in no time, board 4 is moved with speed pattern P1 again generating sliding speed v to lower the viscosity from $\eta_3$ to $\eta_4$ on curve $m_2$, etc.

According to the conventional method, the printing board was lowered in one continuous movement or without stopping, resulting in no effective generation of the sliding speed in the solder paste near the wall of the patterned hole, and thus no reduction of the viscosity and printing defects. Solder paste 13 left on the printing board is as shown in FIG. 8(c). In the method of the present invention, however, the viscosity of only solder paste 13a located nearest to the wall is lowered, without changing the viscosity of the solder paste in the middle of the holes. As a result, the paste is not flagged or deformed, and is applied on printing boards in a quite favorable state.

A second example of the speed patterns is shown in FIG. 4. According to this patterns moving patterns P2 with positive middle value V2 and moving patterns P3 with negative middle value V3 are repeated alternatingly. With this speed pattern, printing board 4 is moved not only downwards but also upwards, so that further lowering of viscosity $\eta$ and the improvement of the mask-detaching performance of solder paste 13 are obtained.

Figure 5:
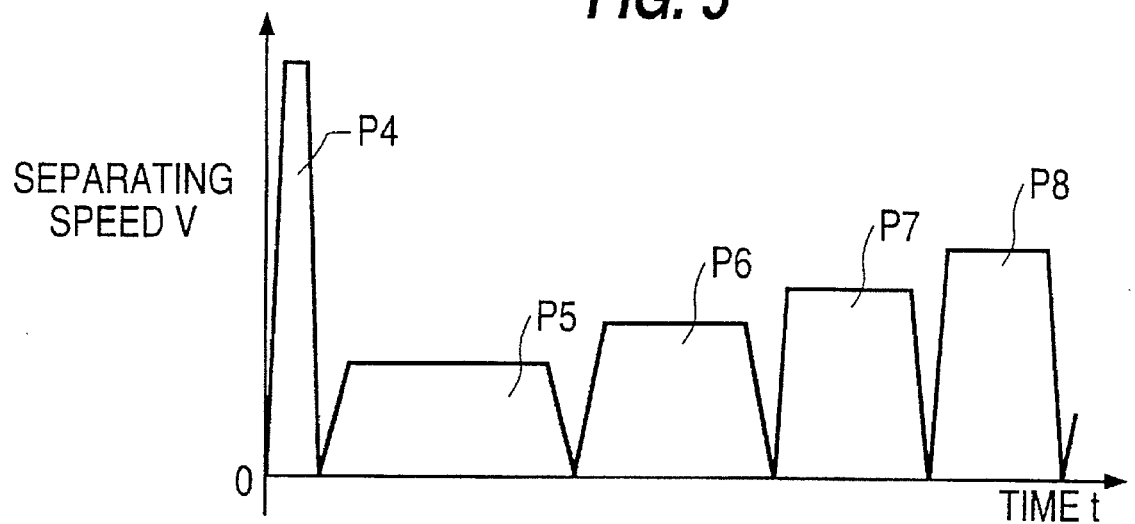
FIG. 5 is a diagram exemplifying still another pattern of the speed versus time.

In FIG. 5 a third example of the speed pattern is shown, in which first speed pattern P4 is given a large middle value as well as the acceleration. According to this pattern, just after the beginning of the movement of the elevation means when the viscosity of solder paste 13 is still large, the speed is changed considerably to give a shock to the solder paste 13a located nearest to the wall of the hole to lower viscosity $\eta$ very rapidly. Also, in the third example, speed patterns P4 to P8 have the same moving distance and the middle values of speed are increased gradually.

Figure 6:
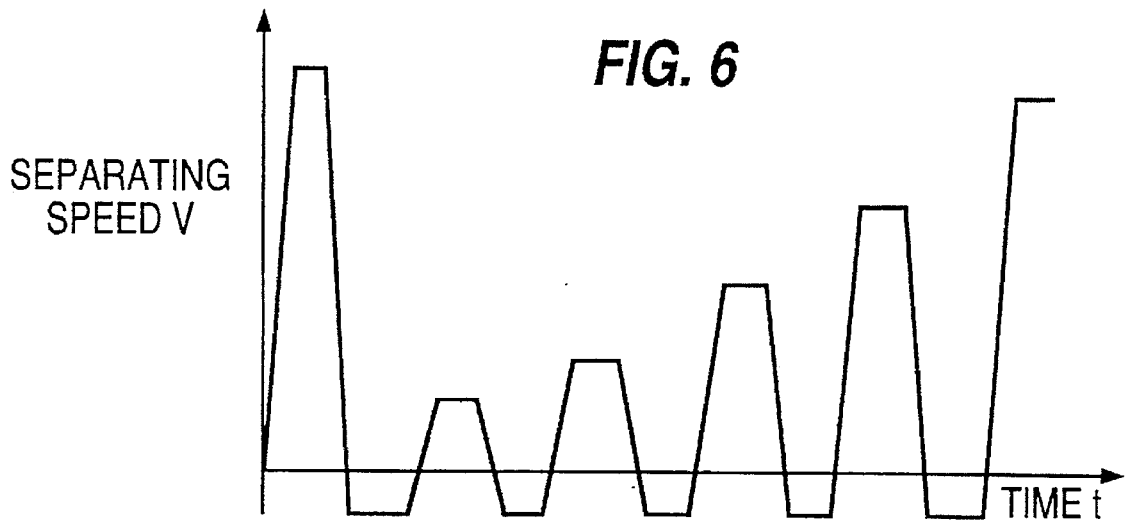
FIG. 6 is a diagram exemplifying still another pattern of the speed versus time.

In a fourth example of the speed patterns, which is shown in FIG. 6, patterns with negative middle values are added to the patterns in the third example.

As the shape of the unit speed pattern, instead of the trapezoid shown above, a triangular shape with no long duration of middle value may be applicable, in accordance with the present invention.

Thus, according to the screen printing apparatus and screen printing method of the present invention in which the separation of the mask plate and the printing board is made with a plurality of zero speeds, rapid sliding is produced in the solder paste near the wall of the patterned holes to lower the viscosity thereof, so that the mask removing characteristic of the solder paste is improved and solder pastes can be obtained on a printed circuit board without deformation.

What is claimed is:

1. A screen printing apparatus comprising:

a board supporting part for supporting a printed circuit board, a mask plate having patterned holes, an elevating means for raising and lowering said board supporting part to make an upper surface of said printed circuit board touch and leave an under side of said mask plate, a squeegee moving on said mask plate to fill solder paste into said patterned holes while the under side of said mask plate is touching the upper surface of said printed circuit board, a controlling part for controlling said elevating means, to move said elevating means in accordance with a speed pattern beginning with a zero value, the middle including a plurality of unit speed patterns having a plurality of nonzero and zero values, and ending with a zero value.

2. A screen printing apparatus according to claim 1, wherein said speed pattern consists of unit speed patterns each having the same and one shape.

3. A screen printing apparatus according to claim 1, wherein said speed pattern consists of unit speed patterns with different shapes.

4. A screen printing apparatus according to claim 1, wherein said speed pattern comprises a unit speed pattern having a positive middle value and another unit speed pattern having a negative middle value arranged alternatingly.

5. A screen printing apparatus according to claim 1, wherein the middle value of a first unit speed pattern is larger than those of the following unit speed patterns.

6. A screen printing apparatus comprising:

a board supporting part for supporting a printed circuit board, a mask plate having patterned holes, an elevating means for raising and lowering said board supporting part to make an upper surface of said printed circuit board touch and leave an under side of said mask plate, a squeegee moving on said mask plate to fill solder paste into said patterned holes while the under side of said mask plate is touching the upper surface of said printed circuit board, a control means for controlling the speed of said elevating means which makes a relative separating speed zero at a plurality of times during the separation of the printed circuit board and the mask plate.

7. A screen printing method comprising the steps of:

bringing a printed circuit board under a mask plate with patterned holes, moving a squeegee on said mask plate to fill solder paste into said patterned holes, and separating said printed circuit board and said mask plate in accordance with a speed pattern beginning with a zero value, the middle including a plurality of unit speed patterns having a plurality of nonzero and zero values, and ending with a zero value.

8. A screen printing method according to claim 7, wherein said speed pattern comprises unit speed patterns having the same and one shape.

9. A screen printing method according to claim 7, wherein said speed pattern comprises unit speed patterns having different shapes.

10. A screen printing method according to claim 7, therein said speed pattern comprises a unit speed pattern with positive middle value and another unit speed pattern with negative middle value alternatingly repeated.

11. A screen printing method according to claim 7, wherein said speed pattern comprises a first unit speed pattern with the middle value larger than that of a second unit speed pattern.

12. A method of screen printing comprising:

making a printed circuit board position and touch the under side of a mask plate with patterned holes, moving a squeegee on said mask plate to fill solder paste in said patterned holes, and separating said printed circuit board and mask plate, wherein a relative separating speed between said printed circuit board and said mask plate includes a plurality of zero values during the separation of said printed circuit board and said mask plate.

* * * * *

UNITED STATES PATENT AND TRADEMARK OFFICE
CERTIFICATE OF CORRECTION

PATENT NO. : 5,623,872
DATED : April 29, 1997
INVENTOR(S) : Michinori TOMOMATSU

It is certified that error appears in the above-indentified patent and that said Letters Patent is hereby corrected as shown below:

Col. 7, line 19 change "therein" to --wherein--.

Signed and Sealed this

Fourteenth Day of April, 1998

Attest:

BRUCE LEHMAN

*Attesting Officer*      *Commissioner of Patents and Trademarks*